(12) United States Patent
Park et al.

(10) Patent No.: US 7,813,388 B2
(45) Date of Patent: Oct. 12, 2010

(54) SELF-PULSATING LASER DIODE

(75) Inventors: Kyung Hyun Park, Daejeon (KR); Hyun Sung Ko, Daejeon (KR); Young Ahn Leem, Daejeon (KR); Min Yong Jeon, Daejeon (KR); Eun Deok Sim, Daejeon (KR); Sung Bock Kim, Daejeon (KR)

(73) Assignee: Electronics And Telecommunications Research Institute, Daejeon (KR)

( * ) Notice: Subject to any disclaimer, the term of this patent is extended or adjusted under 35 U.S.C. 154(b) by 0 days.

(21) Appl. No.: 11/932,937

(22) Filed: Oct. 31, 2007

(65) Prior Publication Data

US 2008/0137694 A1 Jun. 12, 2008

(30) Foreign Application Priority Data

Dec. 6, 2006 (KR) ................ 10-2006-0122874
Jun. 5, 2007 (KR) ................ 10-2007-0054885

(51) Int. Cl.
*H01S 3/098* (2006.01)

(52) U.S. Cl. ................ 372/18; 372/96; 372/102

(58) Field of Classification Search ........... 372/18, 372/96, 102
See application file for complete search history.

(56) References Cited

U.S. PATENT DOCUMENTS

| | | | | |
|---|---|---|---|---|
| 5,249,243 A * | 9/1993 | Skeie | ................ | 385/3 |
| 5,325,382 A | 6/1994 | Emura et al. | | |
| 6,222,669 B1 * | 4/2001 | Roberts et al. | ................ | 359/337 |
| 6,542,522 B1 | 4/2003 | Arahira et al. | | |
| 6,963,436 B2 * | 11/2005 | Watanabe et al. | ................ | 359/239 |
| 2002/0176157 A1 * | 11/2002 | Dave et al. | ................ | 359/344 |
| 2004/0067017 A1 | 4/2004 | Ionov et al. | | |
| 2004/0258125 A1 | 12/2004 | Bauer et al. | | |
| 2005/0018203 A1 | 1/2005 | Hogan | | |
| 2005/0286574 A1 * | 12/2005 | Duan | ................ | 372/28 |
| 2006/0198404 A1 | 9/2006 | Henrichs | | |

FOREIGN PATENT DOCUMENTS

| | | |
|---|---|---|
| JP | 4-215489 A | 8/1992 |
| JP | 8-211433 A | 8/1996 |
| JP | 09-148684 | 6/1997 |
| JP | 11-074592 A | 3/1999 |
| WO | WO-03/015185 A1 | 2/2003 |

OTHER PUBLICATIONS

Young Ahn Leem, et al., "Self-Pulsation in Multisection Laser Diodes With DFB Reflector", IEEE Photonics Technology Letters, vol. 18, No. 4, Feb. 15, 2006.
J. Renaudier, et al. Polarization Insentive 40 GHz Self-Pulsating DBR Lasers with Enhanced Nonlinearities and Wide Self-Pulsation Frequency Tunability., Lasers and Electro-Optics, 2005. (CLEO). Conference on vol. 2, Issue , 22-27 May 2005 pp. 1019-1021 vol. 2.

* cited by examiner

*Primary Examiner*—Minsun Harvey
*Assistant Examiner*—Kinam Park
(74) *Attorney, Agent, or Firm*—Rabin & Berdo, P.C.

(57) ABSTRACT

Provided is a self-pulsating laser diode including: a distributed feedback (DFB) section serving as a reflector; a gain section connected to the DFB section and having an as-cleaved facet at one end; a phase control section interposed between the DFB section and the gain section; and an external radio frequency (RF) input portion applying an external RF signal to at least one of the DFB section and the gain section.

14 Claims, 9 Drawing Sheets

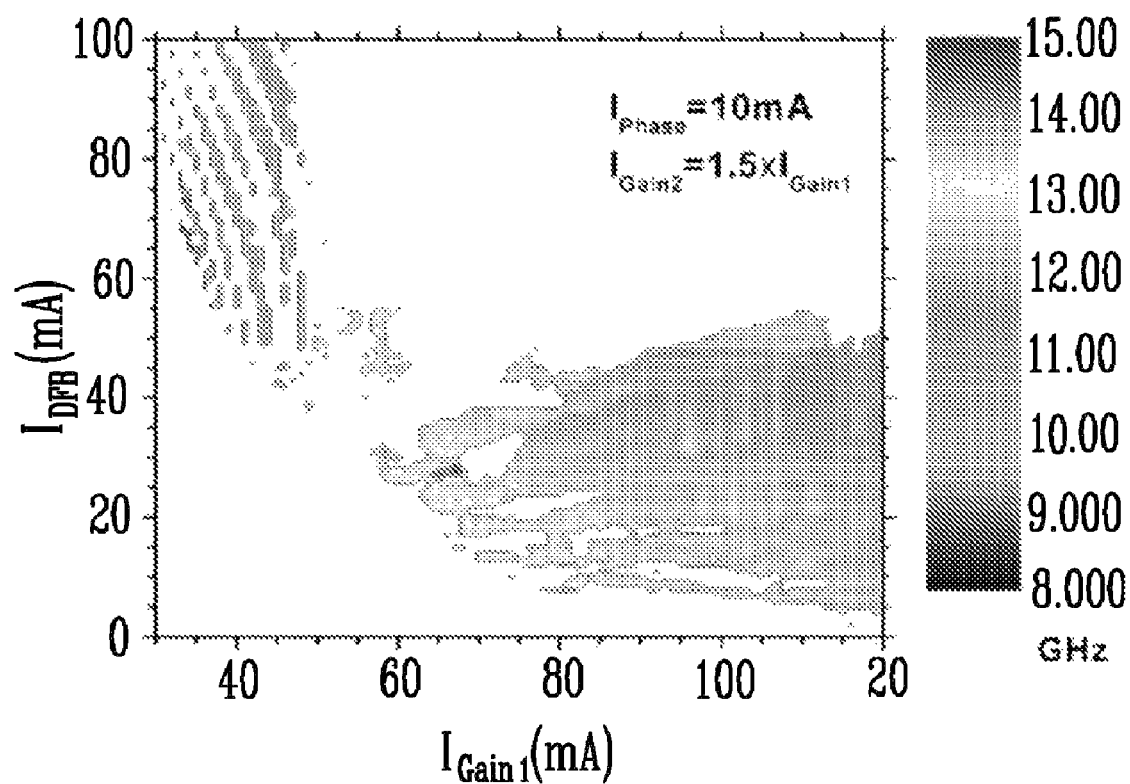

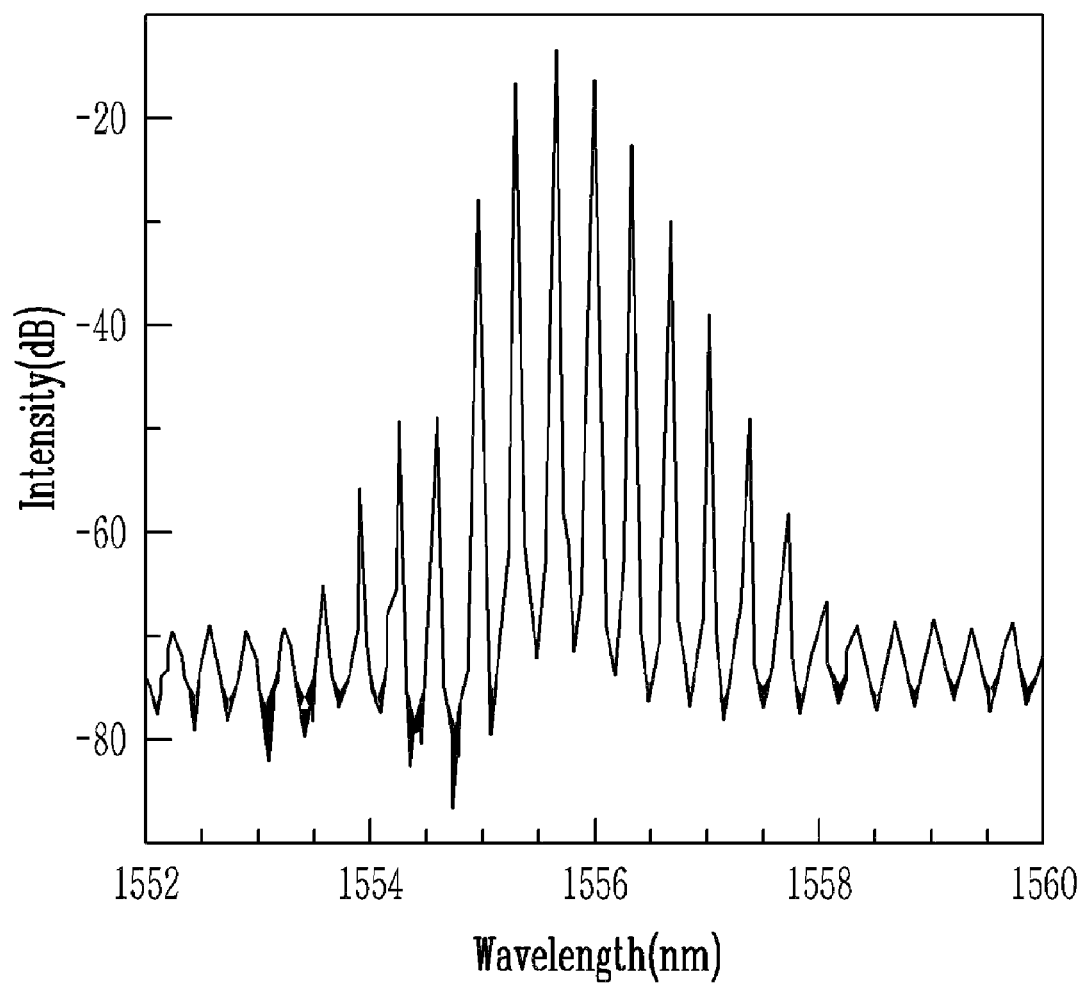

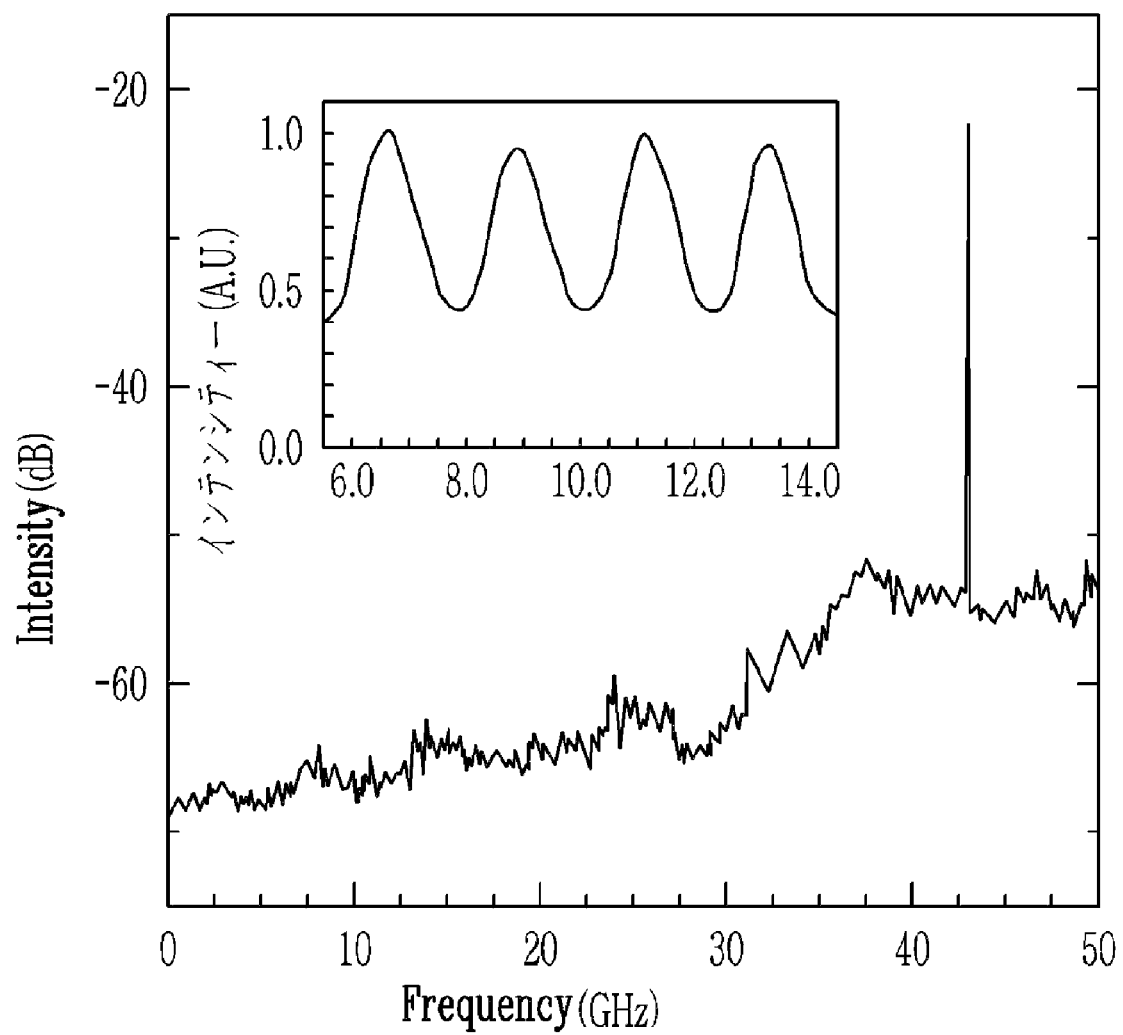

SELF-PULSATING LASER DIODE

CROSS-REFERENCE TO RELATED APPLICATION

This application claims priority to and the benefit of Korean Patent Application Nos. 2006-122874, filed Dec. 6, 2006, and 2007-54885, filed Jun. 5, 2007, the disclosures of which are incorporated herein by reference in their entirety.

BACKGROUND

1. Field of the Invention

The present invention relates to a laser diode, and more particularly, to a self-pulsating laser diode smoothly generating a stable ultra-short pulse using active mode-locking by input of an external radio frequency (RF) among mode-locking phenomena in a laser diode not having a non-linear section such as a saturable absorber.

2. Discussion of Related Art

An optical pulse is used for various purposes, such as clock reproduction by a re-amplifying, re-shaping and re-timing (3R) reproducer in optical communication, a light source in optical communication, a light source for optical sampling, a carrier for RF communication, and so on. In particular, when an optical pulse is generated using a semiconductor laser diode, a device using the same has advantages in size and economical efficiency. For this reason, much research on pulse laser diodes has been conducted.

A physical mechanism causing a laser diode to emit a pulse may be Q-switching, gain switching, mode beating, or mode locking. Since an RF signal is used in Q-switching or gain switching, there are limitations due to the speed of an electronic device and the response speed of a laser diode. Meanwhile, mode beating is generally implemented by a laser diode having a plurality of distributed feedback (DFB) sections. However, a very precise process is required to form these DFB sections.

Mode locking is roughly classified into active mode-locking and passive mode-locking. According to active mode-locking, phase locking, i.e., fixing of a phase difference between modes, is performed by an external RF signal. According to passive mode-locking, a nonlinear section such as a saturable absorber is input into the laser diode to perform phase locking.

However, according to active mode-locking and passive mode-locking, the width of a variable frequency is small, and therefore the manufacturing process is difficult. For example, when a reference frequency is 40 GHz, the width of a variable frequency is less than 1 GHz (2.5%). Therefore, it is difficult to adjust a frequency to a reference frequency by applying current, etc., after forming a device. As a result, a device must be precisely fabricated.

Meanwhile, a laser diode comprising a DFB section, a phase control section, and a gain section generates optical pulses using mode beating occurring between compound cavity modes.

More specifically, when a current equal to or greater than a threshold current is applied to the DFB section, the DFB section operates as a single-mode laser to emit light to the phase control section and the gain section. The emitted light passes through the phase control section and the gain section, and is reflected by an as-cleaved facet, i.e., a cut plane of the end of the gain section, to return back to the DFB section. Due to such reflection, the entire device does not operate in a single mode but oscillates in two modes. The device generates an optical pulse using beating between the two modes.

When an optical pulse is generated by beating between the two modes, the DFB section may be used as just a reflector by applying a current less than a threshold current to the DFB section. In this case, a new pulse is generated.

Since the DFB section serves simply as a reflector, the pulse generation is performed in a single-cavity laser diode in which reflection at an as-cleaved facet and reflection at a DFB reflector constitute a resonator.

In such a structure, physical mechanisms causing pulse emission are Q-switching and mode locking, which is seen as quasi passive mode-locking whereby a fixed number of resonator modes contribute to generating an ultra-short pulse, in consideration of a change in frequency according to device length.

In this connection, such a passive mode-locking phenomenon is observed in a distributed Bragg reflector (DBR) laser diode also. As reported, a normal waveguide structure does not smoothly generate a pulse. However, when a waveguide is formed in an almost square shape, a pulse is smoothly generated by passive mode-locking.

Currently, interaction between nonlinear modes, such as four wave mixing (FWM), is drawing attention as a reason causing passive mode-locking. The waveguide structure having the square cross-section also increases only a light restriction coefficient of the waveguide to increase the nonlinear effect. Here, the light restriction coefficient indicates how much the waveguide restricts light.

However, it is significantly difficult to fabricate a waveguide having a shape close to a square in the case of a laser diode using a DBR.

SUMMARY OF THE INVENTION

The present invention is directed to a self-pulsating laser diode that while maintaining a very large frequency tuning range, which is a merit of a multi-section distributed feedback (DFB) laser diode performing passive mode-locking using a DFB reflector without a saturable absorber, prevents generation of an unstable pulse due to passive mode-locking and generates a very stable ultra-short pulse by inputting the unique frequency of a resonator and an external radio frequency (RF) corresponding to a subharmonic frequency.

One aspect of the present invention provides a self-pulsating laser diode, comprising: a DFB section serving as a reflector; a gain section connected to the DFB section and having an as-cleaved facet at one end; a phase control section interposed between the DFB section and the gain section; and an external RF input portion applying an external RF signal to at least one of the DFB section and the gain section.

Using the laser diode, it is possible to generate a high-frequency carrier corresponding to a high-order harmonic frequency according to application of an external RF subharmonic corresponding to a subharmonic frequency. Thus, a stable, low-priced ultra-short pulse laser can be fabricated, and data encoding is enabled. To be specific, the laser diode can be directly used for transmission and reception of a radio over fiber (RoF) system, which is a system that is expected to come into increasing use.

Here, the external RF input portion may be implemented by an impedance-matched module.

In addition, a current equal to or less than a threshold current may be applied to the DFB section, and the DFB section may become a reflector and constitute a single cavity together with the gain section.

In addition, optical pulse generation and a frequency of the laser diode may be controlled by an amount of current applied to the phase control section, the frequency of the optical pulse may be changed by an amount of current applied to the DFB section, and the number of modes and a pulse width may be determined by the ratio of the width of a reflection spectrum of the DFB section to the mode interval of an entire cavity.

BRIEF DESCRIPTION OF THE DRAWINGS

The above and other objects, features and advantages of the present invention will become more apparent to those of ordinary skill in the art by describing in detail preferred embodiments thereof with reference to the attached drawings, in which:

FIG. 3 is a frequency map of optical pulses generated according to the amount of a current applied to a distributed feedback (DFB) section and a gain section of the laser diode of FIG. 2;

FIGS. 6B to 6D are graphs showing data obtained by measuring optical pulses of the laser diode of FIG. 6A;

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. The following embodiments are described in order to enable those of ordinary skill in the art to embody and practice the present invention.

Figure 1:
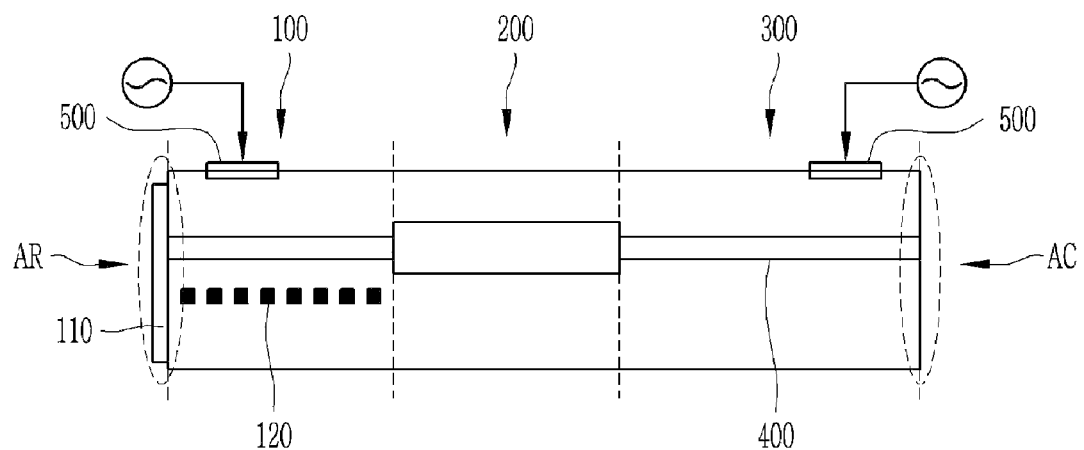
FIG. 1 is a cross-sectional view of a self-pulsating laser diode according to an exemplary embodiment of the present invention.

FIG. 1 is a cross-sectional view of a self-pulsating laser diode according to an exemplary embodiment of the present invention.

Referring to FIG. 1, a self-pulsating laser diode comprises a distributed feedback (DFB) section 100 used as a reflector, a phase control section 200, and a gain section 300. An anti-reflection section AR in which an anti-reflection coating layer 110 is formed is disposed at the left end of the DFB section 100, and an as-cleaved facet (AC) is formed at the right end of the gain section. In addition, a waveguide 400 is formed in the entire device.

In this exemplary embodiment, a current less than a threshold current is applied to the DFB section, thereby using the DFB section as just a reflector. In other words, when a current equal to or more than the threshold current is applied, laser is oscillated in the phase control section and the gain section. On the other hand, when a current less than the threshold current is applied, the DFB section does not generate a mode but only serves as a reflector for a mode oscillated in the gain section.

Here, reflection occurring in the DFB section is a reflection of probability performed through lattices 120 formed in the DFB section. Therefore, the laser diode according to this exemplary embodiment constitutes a cavity as a whole using reflection at the AC and reflection by the reflector of the DFB section.

Meanwhile, the phase control section smoothly generates a pulse and controls the frequency of a pulse by controlling the amount of applied current.

In addition, in order to apply an external RF signal together with a conventional fixed current to each section, an exemplary embodiment of the present invention includes external RF input portions 500 as an impedance-matched module upon fabrication of an optical module. For example, the module may be implemented using a 50 or 25Ω matching circuit. In other words, through the external RF input portions 500 as impedance-matched modules, an external RF signal is input to each of the DFB section 100 and the gain section 300, as illustrated in FIG. 1.

A conventional passive mode-locking structure having no saturable absorber has a drawback in that an ultra-short pulse laser generated by passive mode-locking has a very large timing jitter. Thus, a pulse generated by a passive mode-locking structure having no saturable absorber also has a very large timing jitter.

Conventionally, to solve this problem, an external optical signal is generally applied to generate a stable pulse by oscillator frequency-locking. Here, the external optical signal is used for clock extraction.

On the other hand, in order to overcome the drawback of a passive mode-locking structure, the present invention includes the external RF input portions 500 as impedance-matched modules upon fabrication of an optical module. Thus, an external RF signal can be input, and thereby a stable ultra-short pulse is generated.

Figure 2:
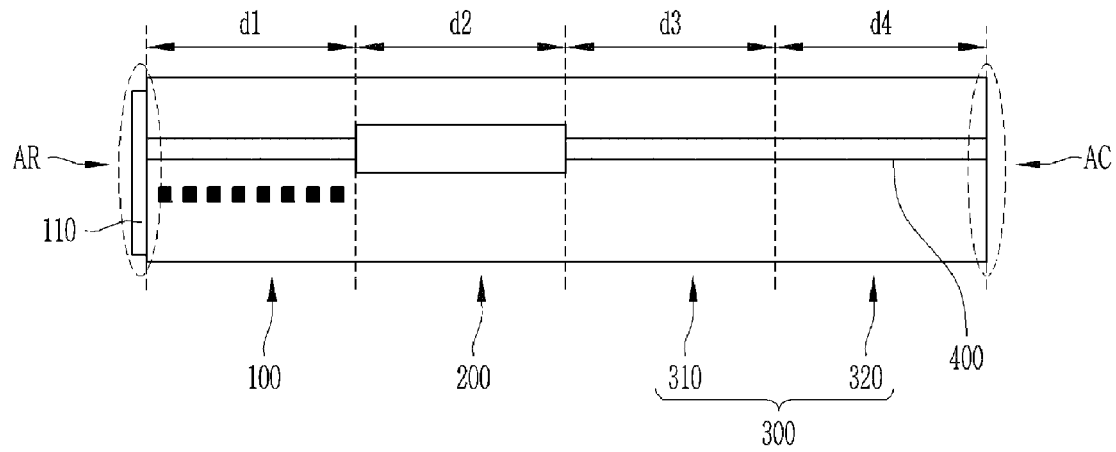
FIG. 2 is a cross-sectional view of a laser diode for generating a 10s GHz optical pulse according to a first exemplary embodiment of the present invention.

FIG. 2 is a cross-sectional view of a laser diode for generating a 10s GHz optical pulse according to a first exemplary embodiment of the present invention.

Although external RF input portions are not illustrated, they are included in the exemplary embodiment shown in FIG. 2, and an external RF is input to each of a DFB section and a gain section through the external RF input portions.

Referring to FIG. 2, the length of the device is so long that a gain section 300 is divided into 2 parts to apply a uniform current to the gain section 300. A length d1 of a DFB section 100 is 0.4 mm, a length d2 of a phase control section 200 is 0.5 mm, and lengths d3 and d4 of two divided gain sections 310 and 320 are 1 mm and 1.5 mm, respectively. Therefore, the length of the entire device is 3.4 mm. In general, the length of a cavity is in inverse proportion to an oscillator frequency and thus cannot be used as a main indicator. FIG. 2 shows an exemplary embodiment for generating a 10 GHz pulse.

Therefore, in another exemplary embodiment, when the length of the entire device is adjusted while maintaining the appropriate length of each section, it is possible to generate a high frequency of 40 GHz or more as a reference frequency while guaranteeing the above-mentioned tuning of 10% of the reference frequency.

FIG. 3 is a frequency map generated according to the amount of current, i.e., vertical axis, applied to the DFB section 100 of the laser diode of FIG. 2 and the amount of current, i.e., horizontal axis, applied to the gain section 300.

Referring to FIG. 3, the upper left part is a pulse generation section by compound cavity mode beating occurring when a current equal to or greater than a threshold current is applied to the DFB section 100, and the lower right part is a pulse generation section to be described with reference to the present invention. The threshold current of the DFB section is 55 mA. As illustrated in FIG. 3, a pulse is generated over a very wide range when a current less than the threshold current is applied to the DFB section.

Pulse generation over the wide range extends an available frequency range and increases production yield. The device generates a pulse in a frequency range between 11.2 and 12.8 GHz and guarantees a tuning of 10% of a reference frequency. The tuning value is 2 times or greater than that of conventional passive mode-locking generally using a saturable absorber, which relieves a strict condition for a length during a process.

In addition, in another exemplary embodiment, when the length of the entire device is adjusted to have a DFB section length of 0.3 mm, a phase control section length of 0.4 mm, and a gain section length of 0.3 mm, it is possible to adjust a reference frequency to be 40 GHz while guaranteeing the above-mentioned tuning of 10% of the reference frequency. In addition, it is possible to remove a saturable absorber from a conventional passive mode-locking laser diode and thus solve the problem of low output power. Consequently, the exemplary embodiment is advantageous in a pulse characteristic and production yield.

Figure 4A:
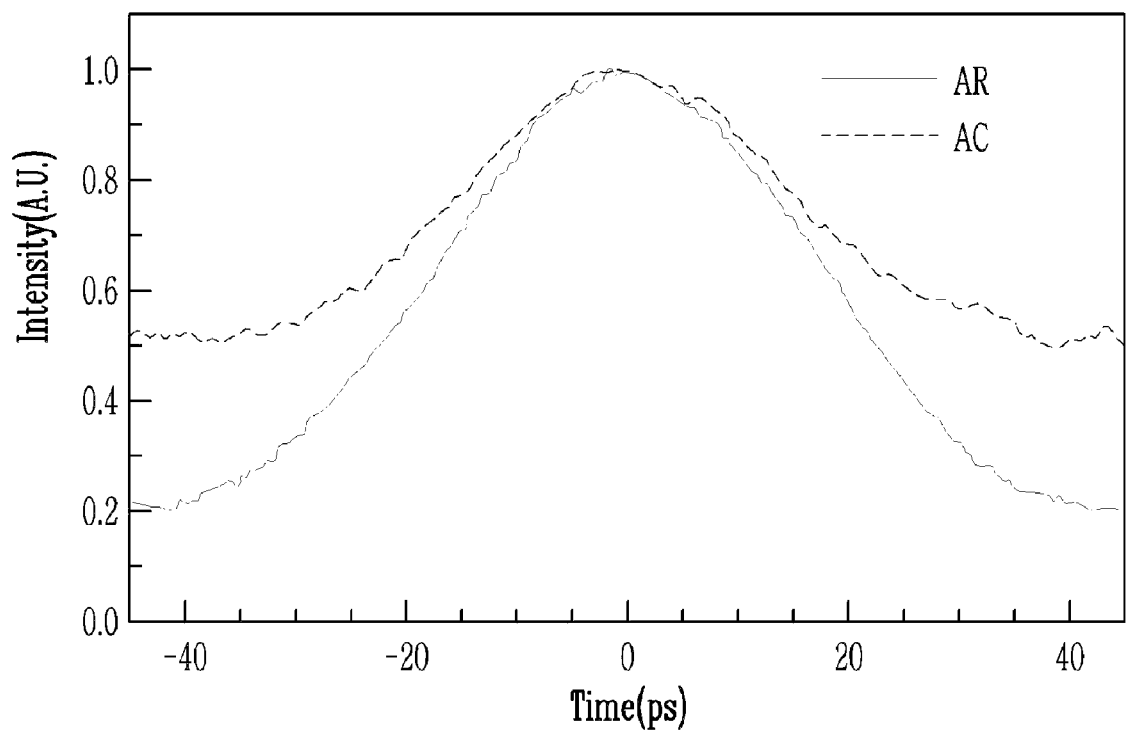
FIGS. 4A and 4B are graphs illustrating the reason why a laser diode of the present invention is capable of generating a pulse over a wide range.
Figure 4B:
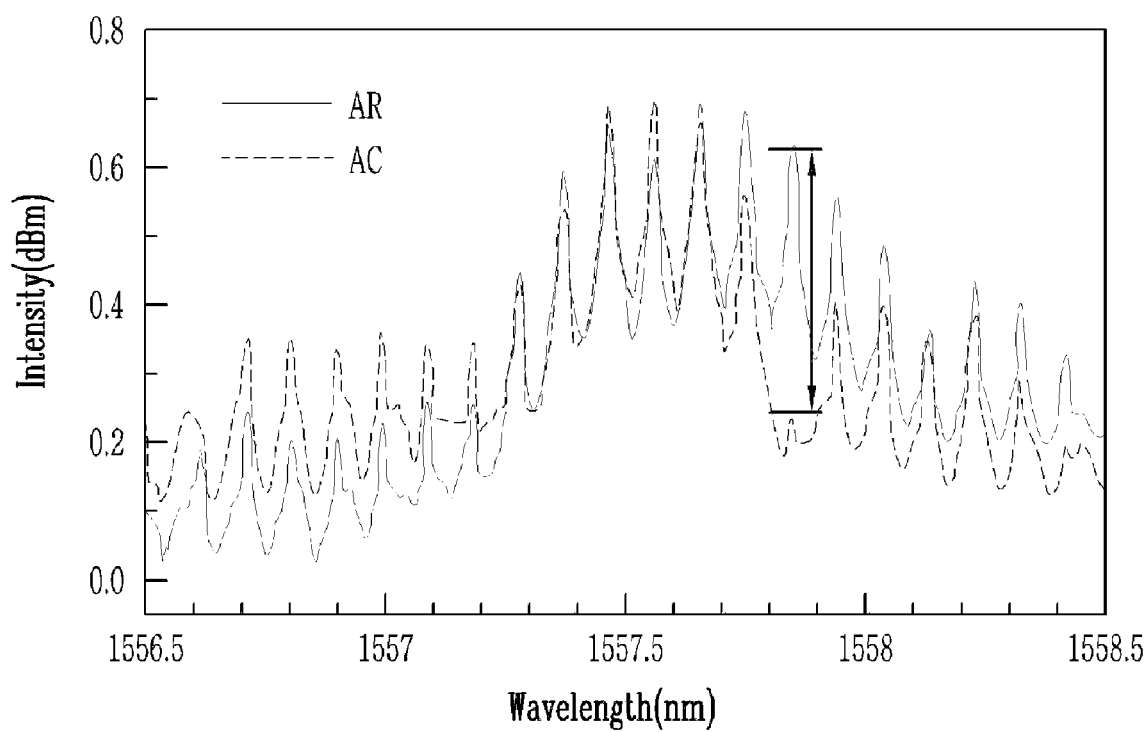

FIGS. 4A and 4B are graphs illustrating the reason why a laser diode of the present invention is capable of generating a pulse over a wide range.

Passive mode-locking in a structure having no saturable absorber is considered as phase locking due to nonlinear interaction, such as four wave mixing (FWM), between modes. In this connection, a method of increasing a light restriction coefficient to increase the nonlinearity has been suggested. However, as mentioned above, it is difficult to fabricate a waveguide for the method.

Therefore, an exemplary embodiment of the present invention uses a DFB section as just a reflector (which will be referred to as a DFB reflector) in a general waveguide structure.

Since the DFB reflector, unlike a distributed Bragg reflector (DBR), uses the same active layer as the gain section for the waveguide, it causes greater nonlinear interaction between oscillation modes than the DBR.

FIG. 4A is a graph experimentally showing the role of a DFB section. In other words, the graph compares results output from the AR of a fabricated device with those measured from the AC.

Referring to FIG. 4A, values of outputs from the AR and the AC are measured by an autocorrelator trace, which is intensity measuring equipment. As can be seen from the graph, the outputs from the AR have a greater extinction ratio (ER) than those from the AC. In other words, the outputs from the AR decrease almost twice as much as those from the AC. The ER indicates how far the highest intensity is from the intensity at the bottom region, and is represented by 10 log (A/B). Here, A is the highest intensity and B is an intensity at the bottom region. Therefore, ER is a barometer representing how close light is to a pulse shape.

FIG. 4B is a graph comparing optical spectra between the two outputs. Referring to FIG. 4B, intensity of a mode in a long wavelength from the AR becomes very strong in comparison with that of the AC. The mode illustrated in FIG. 4B shows a difference of about 40 dB (portion denoted by an arrow). Such a difference cannot be explained by only a reflection spectrum of the DFB section, but is due to amplification of the mode in the long wavelength by nonlinear interaction between modes such as FWM while passing through the DFB section. Here, it is important that the DFB reflector plays a crucial role in the passive mode locking.

Figure 5:
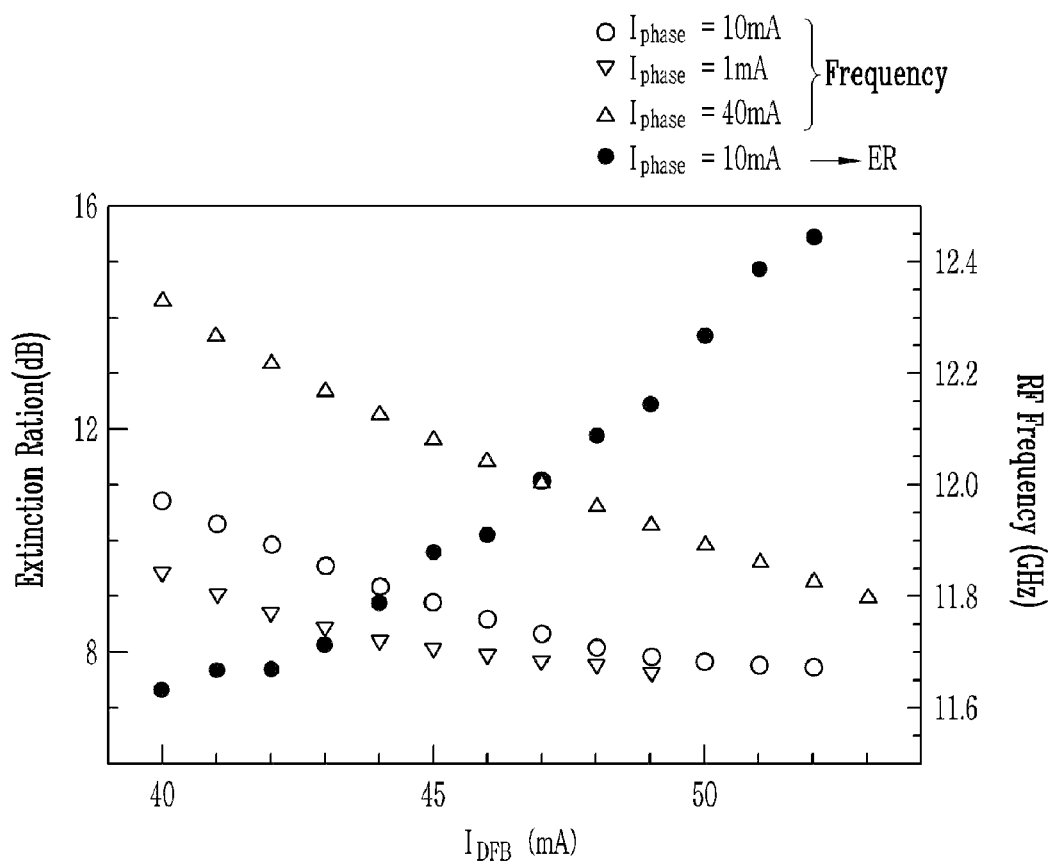
FIG. 5 is a graph showing a change in frequency and extinction ratio according to a drive current.

FIG. 5 is a graph showing a change in frequency and extinction ratio according to a drive current.

Referring to FIG. 5, using the DFB reflector, the frequency of a pulse varies according to a current applied to the phase control section as well as a current applied to the DFB section.

In other words, as a current applied to the DFB section decreases and a current applied to the phase control section increases, the frequency of an optical pulse increases. For this reason, as described above, the laser diode of the present invention has a wide frequency variation region. Also, the laser diode of the present invention has an extinction ratio equal to or greater than 8 dB, which explains smooth pulse generation. Meanwhile, when a current applied to the phase control section is 10 mA, the extinction ratio (black spot) increases as the amount of a current applied to the DFB increases. Therefore, it is advantageous to increase the amount of a current applied to the DFB section as much as possible in a range not exceeding the threshold current of 55 mA.

Figure 6A:
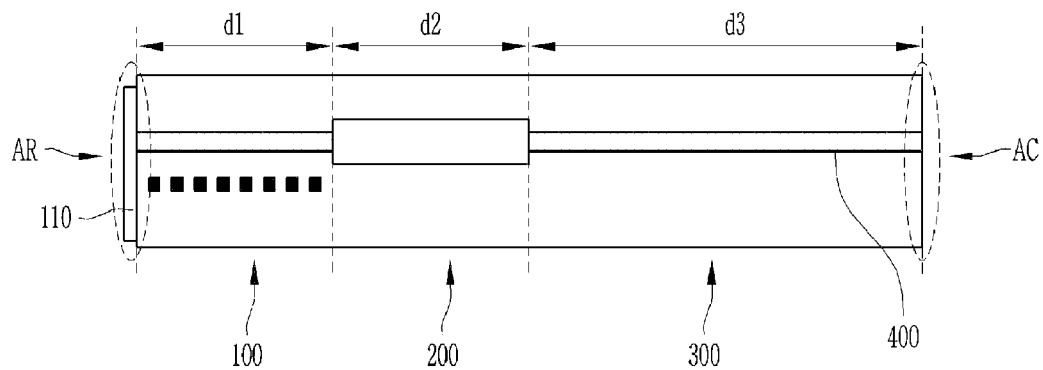
FIG. 6A is a cross-sectional view of a laser diode for generating an optical pulse of 40 GHz or more according to a second exemplary embodiment of the present invention.

FIG. 6A is a cross-sectional view of a laser diode in which a length d1 of a DFB section 100 is 0.3 mm, a length d2 of a phase control section 200 is 0.5 mm, and a length d3 of a gain section 300 is 0.3 to test whether a structure using a DFB reflector operates above 40 GHz.

Although external RF input portions are not illustrated, they are included in the exemplary embodiment shown in FIG. 6A, and an external RF is input to each of the DFB section and the gain section through the external RF input portions.

Figure 6D:
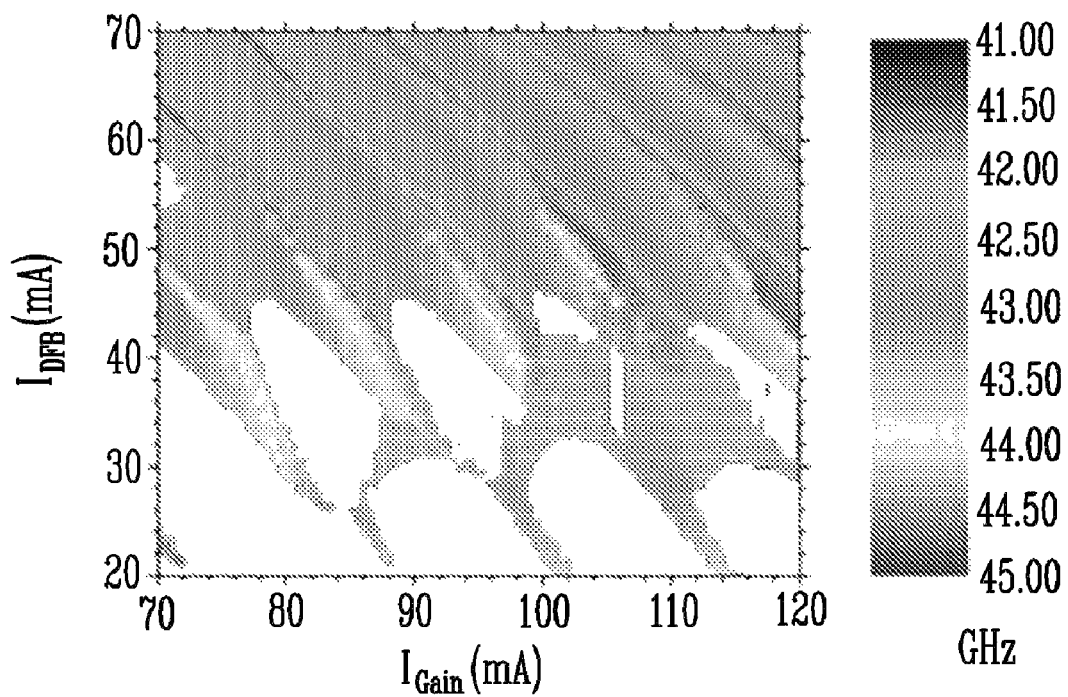

FIGS. 6B to 6D are graphs showing results of optical pulses measured at an AR of the laser diode of FIG. 6A. FIG. 6B is a graph illustrating an optical spectrum showing intensity according to the wavelength of a pulse. FIG. 6C is a graph illustrating an RF spectrum and intensity measured by an autocorrelation trace.

Here, the RF spectrum represents intensity according to the frequency of a pulse and is illustrated in a wide rectangular part at the outer block. The graph measured by the autocorrelation trace is illustrated in a small inner rectangular part. In the graph illustrating intensity according to the frequency of a pulse, a peak is shown near 40 GHz, which indicates that the corresponding pulse is generated at a frequency near 40 GHz.

FIG. 6D is a frequency map of a pulse varying according to a current applied to the DFB section and the gain section.

The graphs show that a pulse is also smoothly generated above 40 GHz when the DFB reflector is used. Therefore, the present invention can smoothly generate an optical pulse of a high frequency in comparison with a conventional laser diode using mode beating by a DFB section.

Meanwhile, according to an experimental result, the number of modes involved in passive mode locking is determined by a mode interval determined by a cavity and the width of a reflection spectrum of a DFB section. In other words, since the mode interval is determined by the entire cavity's length, and the mode is reflected in the DFB section, the number of modes involved in the passive mode locking is determined by the number of modes included in the width of the DFB reflection spectrum.

Therefore, the number of total modes is determined by a ratio of the mode interval to the width of the DFB reflection spectrum. For this reason, it is possible to control the number of modes by changing the mode interval and the width of the DFB reflection spectrum. Also, since the width of a pulse narrows with increase in the number of modes, it is possible to control the width of a pulse by controlling the number of modes. Here, it is possible to control the width of the DBF reflection spectrum by changing an inner lattice structure.

In addition, an exemplary embodiment of the present invention extracts the optical clock of a self-pulsating laser output from a self-pulsating laser diode, and also inputs an external RF to obtain a very stable ultra-short pulse laser.

More specifically, as shown in the exemplary embodiment shown in FIG. 1, according to the present invention, an RF generated outside is input to the self-pulsating laser diode through the external RF input portions, thereby outputting a very stable ultra-short pulse laser.

Figure 7:
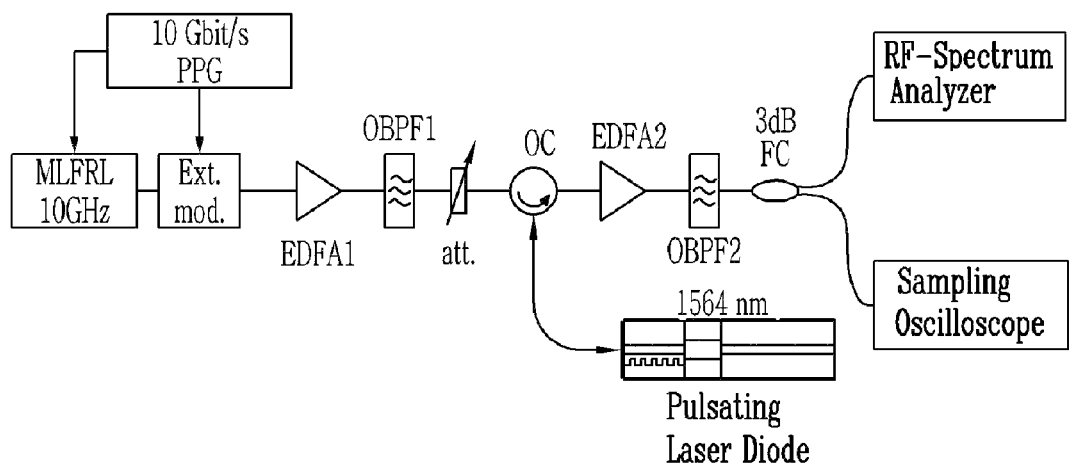
FIG. 7 is a block diagram of an experimental apparatus for measuring a synchronization process based on a 10 Gb/s data signal from a self-pulsating laser according to an exemplary embodiment of the present invention.

FIG. 7 is a block diagram of an experimental apparatus for measuring a synchronization process based on a 10 Gb/s data signal from a self-pulsating laser having no saturable absorber for 40 GHz.

Referring to FIG. 7, an input signal cause an external modulator to generate a 10 Gb/s bit pattern using optical fiber laser having a pulse width of 4 ps. After appropriately adjusting an input power, the pattern is input to a DFB section of a self-pulsating laser diode through an optical circulator. Here, an output optical signal is synchronized with a 40 GHz clock, which is 4 times the input signal.

Figure 8:
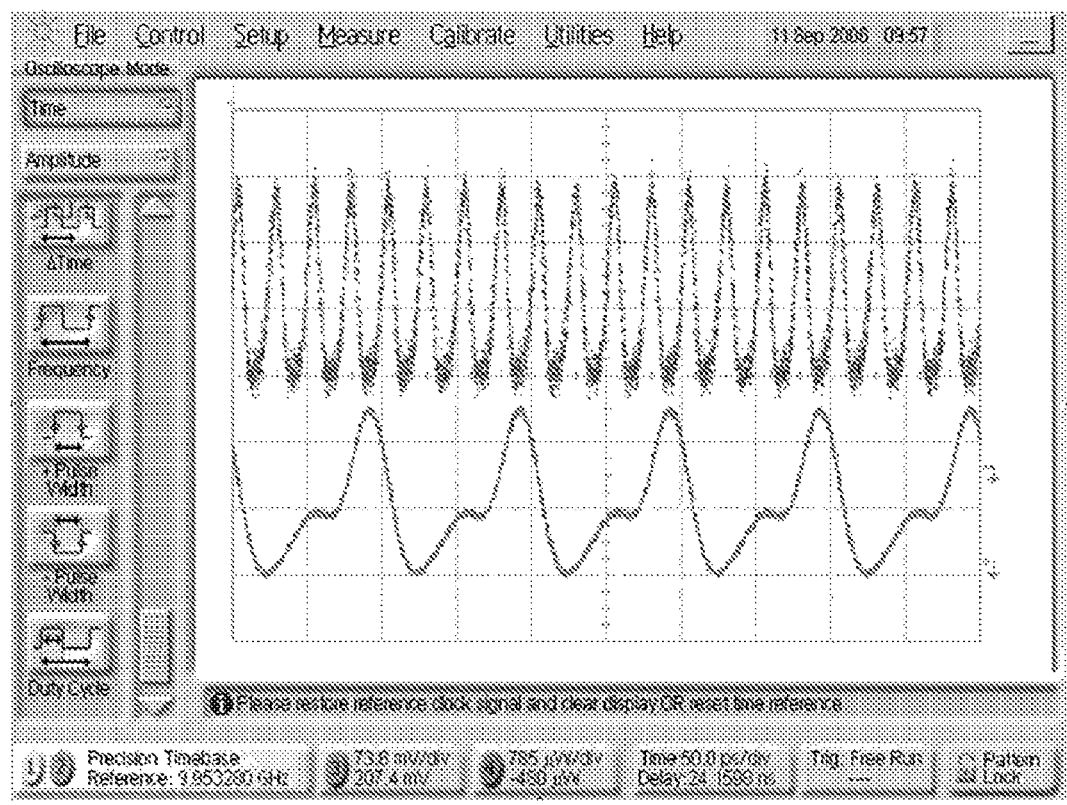
FIG. 8 is a graph showing generation of a high-order frequency that is a 40 GHz optical ultra-short pulse by an external 10 GHz radio frequency (RF) signal input to a self-pulsating laser diode according to an exemplary embodiment of the present invention.

FIG. 8 is a graph showing generation of a high-order frequency that is a 40 GHz optical ultra-short pulse by an external 10 GHz RF signal input to a self-pulsating laser diode according to an exemplary embodiment of the present invention.

Referring to FIG. 8, generation of an ultra-short pulse corresponding to a very stable high-order frequency is illustrated as a result obtained by inputting an external RF to a self-pulsating laser diode according to an exemplary embodiment of the present invention.

In other words, FIG. 8 shows that a 40 GHz ultra-short optical pulse corresponding to a fourth high-order frequency can be generated by an input frequency of 10 GHz.

As described above, it is possible to check an operating characteristic that a very stable ultra-short pulse can be generated by very minute external perturbation. When an external RF input structure for gain and phase modulation is used in each section of a self-pulsating laser diode having no saturable absorber using the operating characteristic, it is possible to develop a very stable ultra-short pulse laser that can be widely used without inputting external light.

According to the present invention, a self-pulsating laser diode can be readily fabricated without a section such as a saturable absorber, a variable frequency region extends further in comparison with a laser diode using a saturable absorber, and there are less variables to consider than a simple single-cavity structure using a saturable absorber.

In addition, it is possible to control a pulse width by determining the number of modes according to the ratio of the reflection spectrum width of a DFB section to the mode interval of the cavity, have a very large frequency tuning range due to input of an external RF, and develop a stable ultra-short pulse laser.

In addition, it is possible to develop a very stable ultra-short pulse laser by inputting an RF alone without external light to a structure having no saturable absorber, develop a low-priced active ultra-short pulse laser using a lower frequency than a reference frequency upon RF packaging because a subharmonic RF locking structure is available, and use a structure capable of coding data of ultra-short pulse laser, generated by inputting an RF to a gain section, as a low-priced radio over fiber (RoF) optical source.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A self-pulsating laser diode, comprising:
   a distributed feedback (DFB) section serving as a reflector and having a current equal to or less than a threshold current applied thereto;
   a gain section connected to the DFB section, having an as-cleaved facet at one end, and operating as a single resonant cavity together with the DFB section;
   a phase control section interposed between the DFB section and the gain section; and
   an external radio frequency (RF) input portion applying an external RF signal to at least one of the DFB section and the gain section to effect passive mode locking.

2. The self-pulsating laser diode of claim 1, wherein the external RF input portion is implemented by an impedance-matched module.

3. The self-pulsating laser diode of claim 1, wherein optical pulse generation and a frequency of the laser diode are controlled by an amount of current applied to the phase control section.

4. The self-pulsating laser diode of claim 1, wherein a frequency of an optical pulse is changed by an amount of current applied to the DFB section.

5. The self-pulsating laser diode of claim 1, wherein the number of modes and a pulse width are determined by a ratio of a width of a reflection spectrum of the DFB section to a mode interval of an entire cavity.

6. The self pulsating laser diode of claim 1, wherein the RF input portion applies the external RF signal to control another signal output by at least one of the DFB section and the gain section.

7. The self pulsating laser diode of claim 1, wherein the RF input portion is configured to apply the external RF signal to both the DFB section and the gain section.

8. A self-pulsating laser diode generating passive mode locking, the laser diode consisting of:
   a distributed feedback (DFB) section serving as a reflector and having a current equal to or less than a threshold current applied thereto;
   a gain section connected to the DFB section and having an as-cleaved facet at one end, and operating as a single resonant cavity together with the DFB section;
   a phase control section interposed between the DFB section and the gain section; and
   a external radio frequency (RF) input portion applying an external RF signal to at least one of the DFB section and the gain section to effect passive mode locking.

9. The self-pulsating laser diode of claim 8, wherein the external RF input portion is implemented by an impedance-matched module.

10. The self-pulsating laser diode of claim 8, wherein optical pulse generation and a frequency of the laser are controlled by an amount of current applied to the phase control section.

11. The self-pulsating laser diode of claim 8, wherein a frequency of an optical pulse is changed by an amount of current applied to the DFB section.

12. The self-pulsating laser diode of claim 8, wherein the number of modes and a pulse width are determined by a ratio of a width of a reflection spectrum of the DFB section to a mode interval of an entire cavity.

13. The self pulsating laser diode of claim 8, wherein the RF input portion applies the external RF signal to control another signal output by at least one of the DFB section and the gain section.

14. The self pulsating laser diode of claim 8, wherein the RF input portion is configured to apply the external RF signal to both the DFB section and the gain section.

* * * * *